(12) United States Patent
Liu (10) Patent No.: US 9,291,661 B2
(45) Date of Patent: Mar. 22, 2016

(54) MONITORING CIRCUIT AND SYSTEM FOR ESD PROTECTION DEVICE

(71) Applicant: WISTRON CORP., New Taipei (TW)

(72) Inventor: Chris Liu, New Taipei (CN)

(73) Assignee: WISTRON CORP., New Taipei (TW)

( * ) Notice: Subject to any disclaimer, the term of this patent is extended or adjusted under 35 U.S.C. 154(b) by 193 days.

(21) Appl. No.: 13/831,569

(22) Filed: Mar. 14, 2013

(65) Prior Publication Data

US 2014/0176153 A1      Jun. 26, 2014

(30) Foreign Application Priority Data

Dec. 21, 2012   (CN) .......................... 2012 1 0564220

(51) Int. Cl.
  *G01R 31/02*      (2006.01)
(52) U.S. Cl.
  CPC ..................................... *G01R 31/026* (2013.01)
(58) Field of Classification Search
  CPC .... G01R 31/026; G01R 29/12; G08B 21/185; G08B 21/00–23/00; H02H 3/13–3/167; H02H 3/04–3/042; H02H 5/105; H05F 3/02
  USPC ........................... 324/525, 500, 512, 537, 457
  See application file for complete search history.

(56) References Cited

U.S. PATENT DOCUMENTS

| | | | | | |
|---|---|---|---|---|---|
| 4,558,309 | A | * | 12/1985 | Antonevich | .................. 340/649 |
| 4,649,374 | A | * | 3/1987 | Hoigaard | ................... 340/573.1 |
| 4,710,751 | A | * | 12/1987 | Webster | ........................ 340/522 |
| 4,785,294 | A | * | 11/1988 | Campbell | ..................... 340/649 |
| 5,057,965 | A | * | 10/1991 | Wilson | .......................... 361/212 |
| 5,408,186 | A | * | 4/1995 | Bakhoum | ..................... 324/509 |
| 5,422,630 | A | * | 6/1995 | Quinn et al. | .................. 340/661 |
| 5,519,384 | A | * | 5/1996 | Chanudet et al. | ............. 340/649 |
| 5,952,931 | A | * | 9/1999 | Chotichanon et al. | ........ 340/649 |
| 5,969,626 | A | * | 10/1999 | Maciel | .......................... 340/649 |
| 6,028,761 | A | | 2/2000 | Cooter | |
| 6,150,945 | A | * | 11/2000 | Wilson | .......................... 340/661 |

(Continued)

FOREIGN PATENT DOCUMENTS

| | | |
|---|---|---|
| TW | M350946 U | 2/2009 |
| TW | M365035 U | 9/2009 |

OTHER PUBLICATIONS

The office action of the corresponding Taiwanese application.

*Primary Examiner* — Patrick Assouad
*Assistant Examiner* — Demetrius Pretlow
(74) *Attorney, Agent, or Firm* — CKC & Partners Co., Ltd.

(57) ABSTRACT

A monitoring circuit and a monitoring system for electrostatic discharge (ESD) protective device are disclosed herein. The monitoring circuit includes an oscillating unit, a signal processing unit and a comparator. The oscillating unit includes a first monitoring end and a second monitoring end. The first monitoring end is configured to be electrically connected to an ESD protective device. The second monitoring end is configured to be electrically connected to ground. When the first monitoring end is not electrically contacted to a user's body or the second monitoring end is not connected to ground, the oscillating unit is configured to output an oscillating signal. The signal processing unit is electrically connected to the oscillating unit, and is configured to output a first voltage according to the oscillating signal. The comparator is configured to compare the first voltage and a reference voltage, and correspondingly output an alarm signal.

14 Claims, 3 Drawing Sheets

(56) References Cited

U.S. PATENT DOCUMENTS

| | | |
|---|---|---|
| 6,205,408 B1 * | 3/2001 | Jubin et al. .................... 702/182 |
| 6,510,987 B1 * | 1/2003 | Hengriprasopchoke et al. ............................ 235/380 |
| 6,809,522 B2 * | 10/2004 | Nguyen ........................ 324/457 |
| 6,930,612 B1 * | 8/2005 | Kraz et al. .................... 340/649 |
| 7,817,057 B2 * | 10/2010 | Bumanlag et al. ............ 340/687 |
| 8,138,937 B2 * | 3/2012 | Yang .............................. 340/649 |

* cited by examiner

MONITORING CIRCUIT AND SYSTEM FOR ESD PROTECTION DEVICE

RELATED APPLICATION

This application claims priority to Chinese Application Serial Number 201210564220.8, filed Dec. 21, 2012, which is herein incorporated by reference.

BACKGROUND

1. Field of Invention

The present disclosure is directed to a monitoring circuit and a monitoring system. More particularly, the present invention is directed to a monitoring circuit and a monitoring system for ESD protection device.

2. Description of Related Art

With the advance in electronic technology, a wide variety of electronic products have been used in our daily life.

Generally, in the manufacturing process of integrated circuits or electronic components for the electronic products, ESD protection is needed for preventing electrostatic charges from entering into the electronic products and damaging the electronic products. In a traditional way, the operator wears an ESD protection device (e.g., an electrostatic wrist strap) which is in contact with the operator's body and connected to the ground through a ground line, so as to conduct the electrostatic charges to the ground. However, in practice, the ESD protection device may fail to be electrically contacted to the operator's body or the ground line fail to be electrically connected to the ESD device or the ground, causing the electrostatic charges to flow in the electronic products and damage the electronic products.

Therefore, a monitoring circuit and a monitoring system for ESD protection device are desired.

SUMMARY

One aspect of the present invention is a monitoring circuit for monitoring whether ESD device and ground line are correctly configured. In accordance with one embodiment of the present invention, the monitoring circuit is configured to be electrically connected to an ESD protection device and a ground line. The ESD protection device is configured to be contacted with a users body. The ground line is configured to be connected to the ground. The monitoring circuit includes an oscillating unit, a signal processing unit, and a comparator. The oscillating unit includes a first monitoring end and a second monitoring end. The first monitoring end is configured to be electrically connected to the ESD protection device. The second monitoring end is configured to be electrically connected to the ground line. The oscillating unit is configured to output an oscillating signal in a case that the first monitoring end is not electrically connected to the ESD protection device which is not contacted to the user's body, the second monitoring end is not electrically connected to the ground line, or the ground line is not connected to the ground. The signal processing unit is electrically connected to the oscillating unit, configured to receive the oscillating signal and to output a first voltage according to the oscillating signal. The comparator is electrically connected to the signal processing unit, configured to compare the first voltage and a reference voltage and to correspondingly output an alarm signal.

In accordance with one embodiment of the present invention, the signal processing unit includes a filter subunit including a capacitor. The filter subunit is configured to filter the oscillating signal utilizing the capacitor, so as to output the first voltage.

In accordance with one embodiment of the present invention, the oscillating unit is further configured to output a DC voltage signal in a case that the first monitoring end is electrically connected to the ESD protection device which is contacted to the user's body, the second monitoring end is electrically connected to the ground line which is connected to the ground.

In accordance with one embodiment of the present invention, the signal processing unit is further configured to output a second voltage according to the DC voltage signal, the comparator is further configured to compare the second voltage and the reference voltage and to correspondingly stop outputting the alarm signal.

In accordance with one embodiment of the present invention, the signal processing unit includes a dividing subunit configured to divide a supply voltage according to the DC voltage signal, so as to output the second voltage.

In accordance with one embodiment of the present invention, the monitoring circuit further includes a dividing unit, electrically connected to the second monitoring end, and configured to provide an electrostatic ground voltage to the second monitoring end.

In accordance with one embodiment of the present invention, the electrostatic ground voltage is equal to the reference voltage.

In accordance with one embodiment of the present invention, the oscillating unit includes an amplifier, a first resistor, a second resistor, a third resistor, a fourth resistor, a first capacitor, a second capacitor, a fifth resistor, and a variable resistor. The first resistor includes a first end and a second end, wherein the first end of the first resistor is electrically connected to the first monitoring end, and the second end of the first resistor is electrically connected to the output end of the amplifier. The second resistor includes a first end and a second end, wherein the first end of the second resistor is electrically connected to the first monitoring end, and the second end of the second resistor is electrically connected to the second input end of the amplifier. The third resistor includes a first end and a second end, wherein the first end of the third resistor is electrically connected to the second monitoring end, and the second end of the third resistor is electrically connected to the second input end of the amplifier. The fourth resistor includes a first end and a second end, wherein the first end of the fourth resistor is electrically connected to the output end of the amplifier, and the second end of the fourth resistor is electrically connected to the first input end of the amplifier. The first capacitor includes a first end and a second end, wherein the first end of the first capacitor is electrically connected to the first input end of the amplifier. The second capacitor includes a first end and a second end, wherein the first end of the second capacitor is electrically connected to the output end of the amplifier. The fifth resistor includes a first end and a second end, wherein the first end of the fifth resistor is electrically connected to the second end of the first capacitor and the second end of the second capacitor. The variable resistor includes a first end and a second end, wherein the first end of the variable resistor is electrically connected to the second end of the fifth resistor, the second end of the variable resistor is electrically connected to the second monitoring end.

In accordance with one embodiment of the present invention, the signal processing unit includes a diode, a sixth resistor, a seventh resistor, and a third capacitor. The diode includes a cathode end and an anode end, wherein the cathode end of the diode is electrically connected to the first end of the fourth resistor. The sixth resistor includes a first end and a second end, wherein the first end of the sixth resistor is electrically connected to the comparator, and the second end of the sixth resistor is electrically connected to the anode end of the diode. The seventh resistor includes a first end and a second end, wherein the first end of the seventh resistor is electrically connected to the first end of the sixth resistor, and the second end of the seventh resistor is configured to receive a supply voltage. The third capacitor includes a first end and a second end, wherein the first end of the third capacitor is electrically connected to the first end of the sixth resistor, the second end of the third capacitor is configured to receive the supply voltage.

Another aspect of the present invention is a monitoring system. The monitoring system can be configured to monitor whether at least one ESD protection device and ground line are correctly configured. In accordance with one embodiment of the present invention, the monitoring system includes a monitoring server, and at least one annunciator. The monitoring server is configured to output a state request signal. The annunciator is electrically connected to the monitoring server. The annunciator includes a communication module, a monitoring circuit, and a control module. The monitoring circuit is as described in the previous aspect, and will not be repeated herein. The control module is configured receive the alarm signal and the state request signal, and to output a state reply signal to the monitoring server through the communication module according the alarm signal and the state request signal.

Given the above, by implementing the above embodiments according to the present invention, the monitoring circuit can output an alarm signal in the condition that the first monitoring end is not electrically connected to the user's body or the second monitoring end is not connected to the ground, such that the manager can acknowledge the occurrence of an error condition to at the first time prevent electrostatic charges from entering into the electronic products and causing damage in the electronic products.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

For the term "electrically connect" or "connect" used herein, both of them can refer to the physical contact or electrical contact performed directly or indirectly between two or more elements. The term "electrically connect" or "connect" can further refer to the interoperation or interaction between two or more elements.

For the term "be electrically connected to the ground" or "be connected to the ground" used herein, both of them can refer to a component or an end be electrically connected to the ground and forms a pathway enabling the charges on the component or the end to flow to the ground via the pathway.

Figure 1:
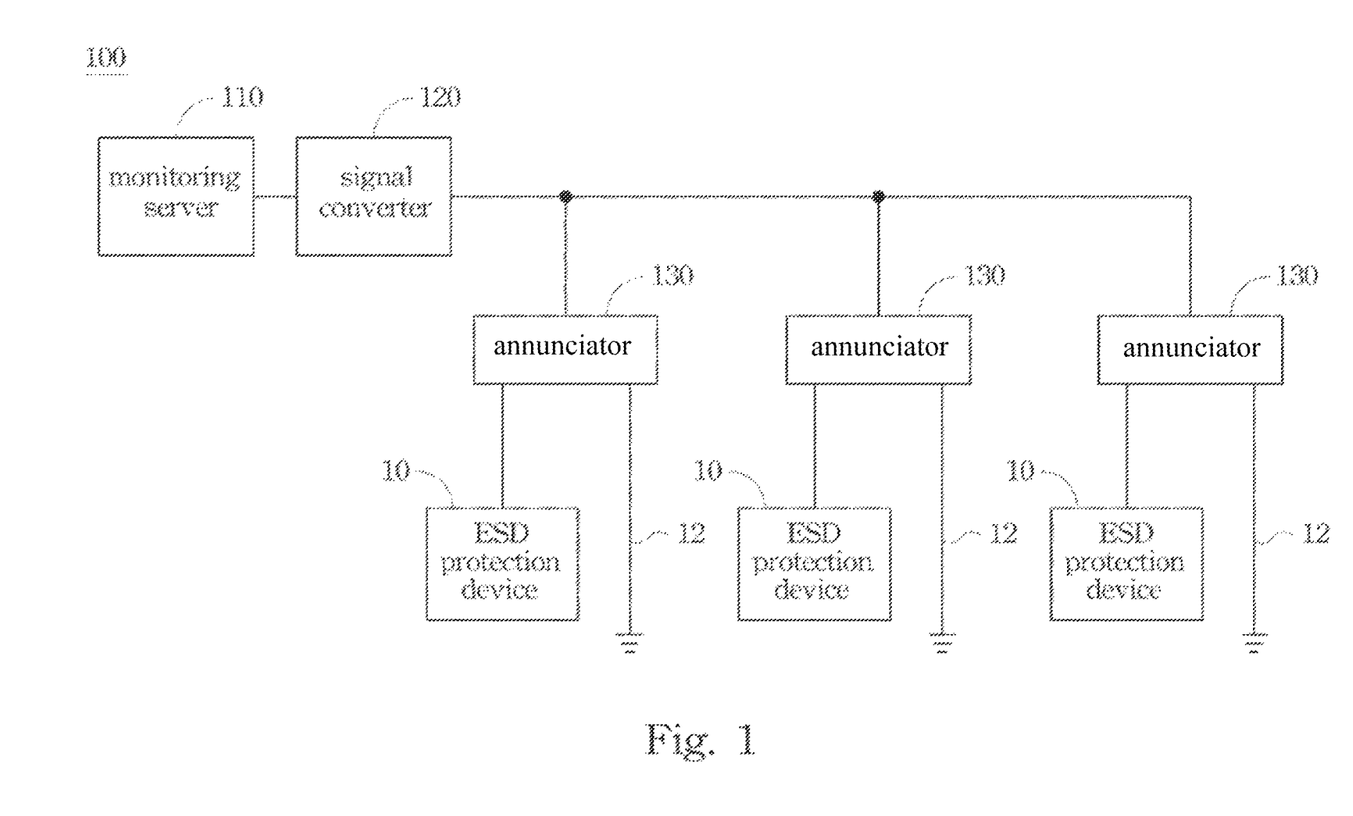
FIG. 1 is a schematic diagram illustrating a monitoring system in accordance with one embodiment of the present invention.

FIG. 1 is a schematic diagram illustrating a monitoring system 100 in accordance with one embodiment of the present invention. The monitoring system includes a monitoring server 110, a signal converter 120, and at least one annunciator 130. The monitoring server 110 is, for example, a computer. The monitoring server 110 can be electrically connected to the signal converter 120. The signal converter 120 can be electrically connected to the annunciator 130 through a bus (e.g., RS-485 bus).

In this embodiment, the monitoring server 110 can output a state request signal to the annunciator 130 through the signal converter 120, to inquire a current state of the annunciator (such as the annunciator 130 is turned off, an error condition, or normal). The annunciator 130 can detect whether the ESD protection device 10 and the ground line is correctly configured, and can output a state reply signal to the monitoring server 110 through the signal converter 120 when receiving the state request signal, so as to tell the monitoring server 110 the current state of the annunciator 130. After receiving the state reply signal from the annunciator 130, the monitoring server 110 can display the current state of the annunciator 130.

In this embodiment, the monitoring server 110 can transmit and receive a first type signal (e.g., RS-232 signal). The annunciator 130 can transmit and receive a second type signal (e.g., RS-485 signal). The signal converter 120 can be used to perform the transformation between the first type signal and second type signal. It should be noted that, in some embodiments, the monitoring server 110 and the annunciator 130 can transmit and receive the same type signal, and can communicate to each other without the signal converter 120. In such a case, the signal converter 120 can be omitted.

On the other hand, the ESD protection device 10 is, for example, an electrostatic wrist strap, configured to be contacted to a user's body. The ground line 12 is configured to be connected to the ground. The ESD protection device 10 can be electrically connected to the ground line 12, so as to enable the electrostatic charges in the user's body to be conducted to the ground through the ESD protection device 10 and the ground line 12.

Moreover, in a case that the monitoring system 100 includes more than one annunciator 130, the monitoring server 110 can poll the annunciators 130, so as to acknowledge the current states of the annunciators 130. For example, the monitoring server 110 can inquire the current states of the plurality of annunciators 130 having different addresses in sequence.

Furthermore, the monitoring server 110 and the annunciator 130 can transmit the signals to each other in half-duplex operation.

Figure 2:
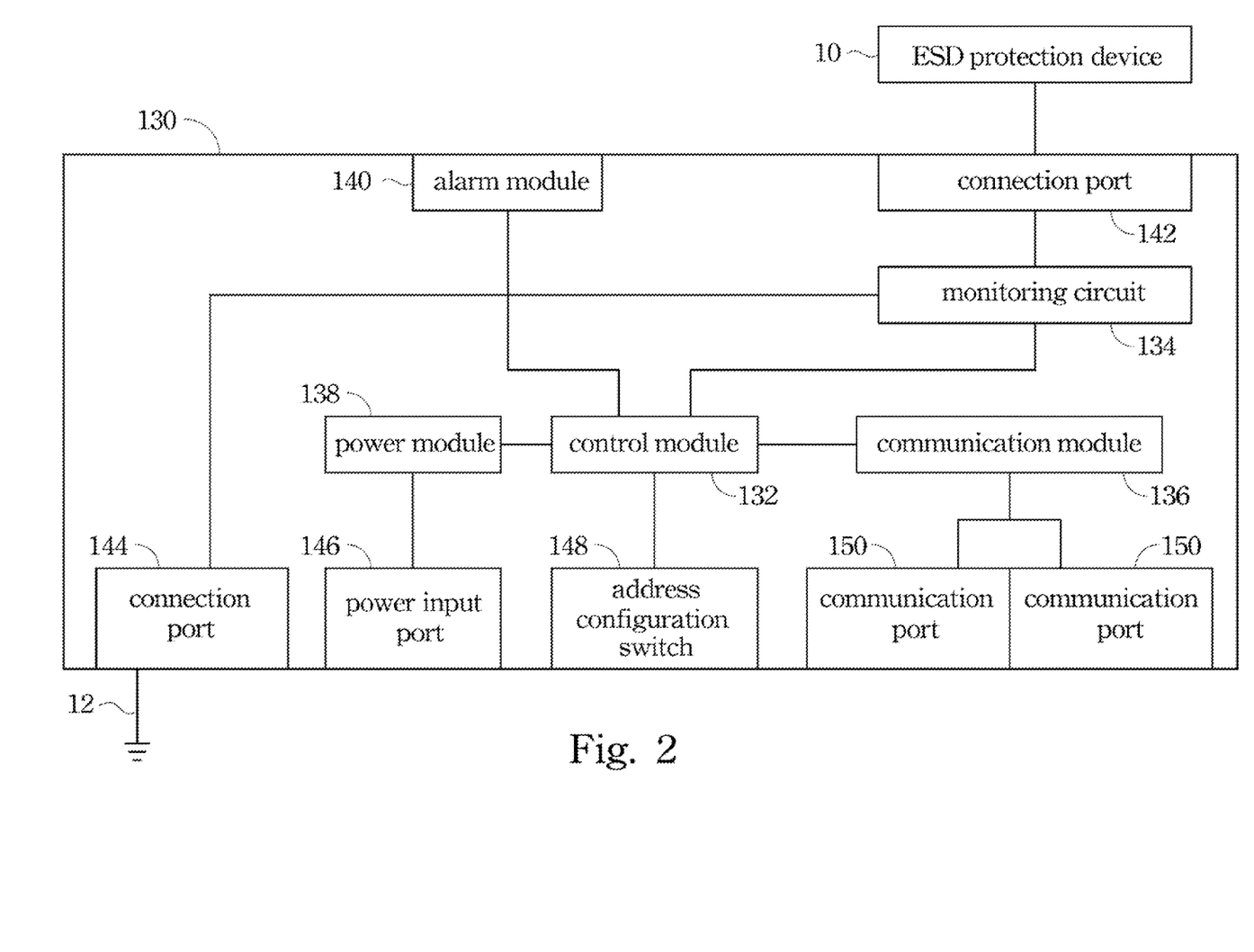
FIG. 2 is a schematic diagram illustrating an annunciator in accordance with one embodiment of the present invention.

FIG. 2 is a schematic diagram illustrating the annunciator 130 in accordance with one embodiment of the present invention. The annunciator 130 can include a control module 132, a monitoring circuit 134, a communication module 136, a power module 138, an alarm module 140, a connection port 142 for the ESD protection device 10, a connection port 144 for the ground line 12, a power input port 146, an address configuration switch 148, and a communication port 150.

In this embodiment, the power module 138 can receive an input voltage through the power input port 146, and provide required voltages for other components inside the annunciator 130.

The address of the annunciator 130, for example, can but not limited to be settled through the address configuration switch 148. The address configuration switch 148, for example, can be a DIP switch.

The connection port 142 can be connected to the ESD protection device 10. The connection port 144 can be connected to the ground line 12. The monitoring circuit 134 can monitor whether the ESD protection device 10 is electrically contacted to the user's body (i.e., whether the ESD protection 10 is electrically connected to the connection port 142 for the ESD protection 10 and whether the ESD protection device 10 is electrically contacted to the user's body) and monitor whether the connection port 144 for the ground line 12 is electrically connected to the ground (i.e., whether the ground line 12 is electrically connected to the connection port 144 for the ground line 12 and whether the ground line 12 is connected to the ground). The monitoring circuit 134 can output an alarm signal to the control module 132 in a condition that the connection port 142 for the ESD protection 10 is not electrically contacted to the user's body and the connection port 144 for the ground line 12 is not electrically connected to the ground. The control module 132 can receive and output the alarm signal to the alarm module 140.

The alarm module 140 can be, for example, a buzzer and/or a light-emitting diode module. When the alarm module 140 does not receive the alarm signal, the buzzer does not raise an alarm sound and/or the light-emitting diode module emits a first light (e.g., a green light). When the alarm module 140 receives the alarm signal, the buzzer raises an alarm sound and/or the light-emitting diode module emits a second light (e.g., a red light).

The control module 132 can be, for example, a microprocessor, can receive the state request signal through the communication module 136 and the communication port 150. The control module 132 can output the state request signal through the communication module 136 and the communication port 150 according to whether the alarm signal outputted from the monitoring circuit 134 is received.

The control module 132 can transmit and receive a third type signal (e.g., a transistor-transistor logic (TTL) signal). The communication module 136 can be configured to perform the transformation between the third type signal and second type signal, so as to enable the state request signal outputted from the control module to be transmitted on the bus. In addition, the communication module 136 can perform the signal transformation with different ground systems, so as to avoid the common-mode interference.

Figure 3:
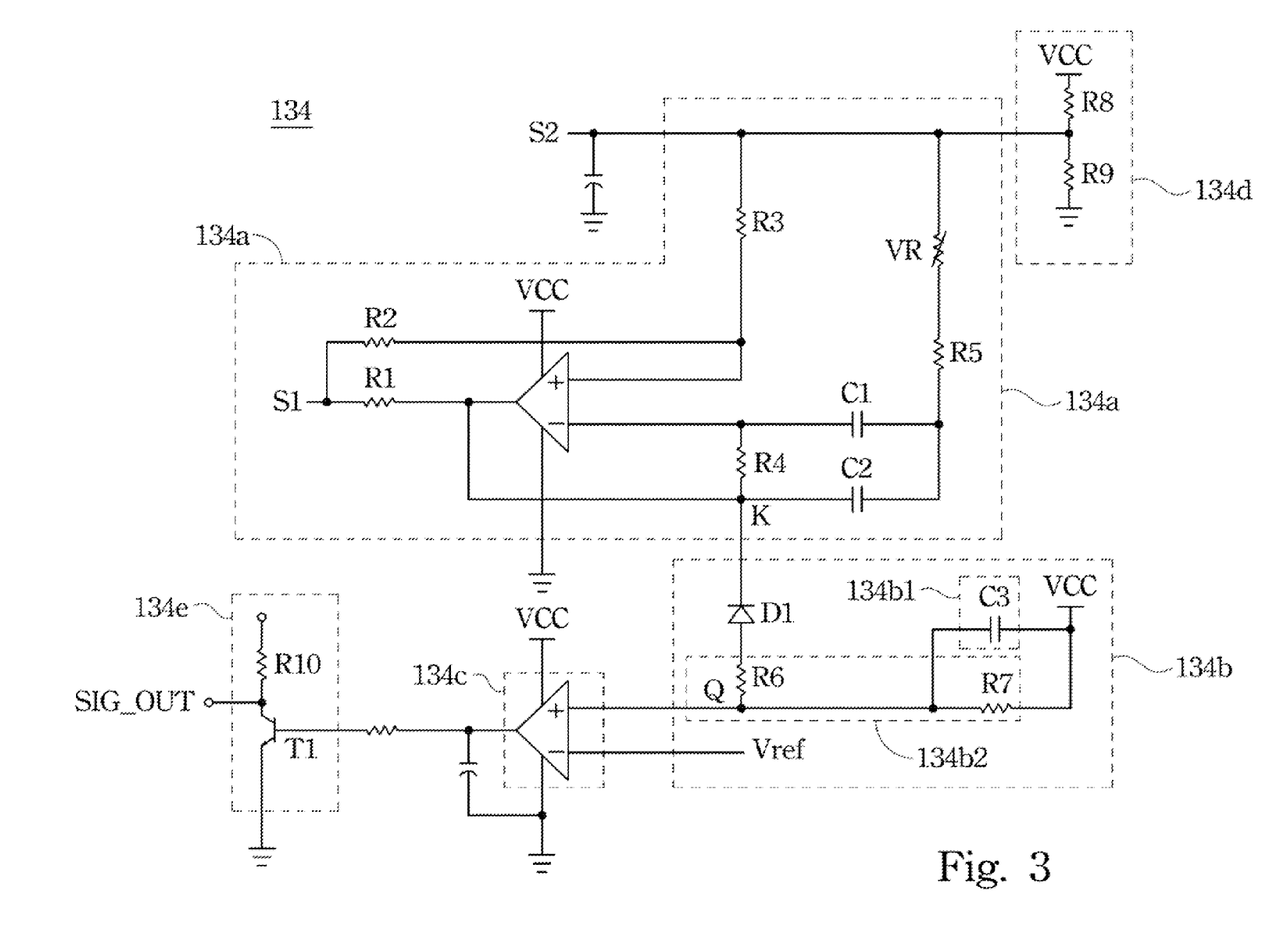
FIG. 3 is a schematic diagram illustrating a monitoring circuit in accordance with one embodiment of the present invention.

FIG. 3 is a schematic diagram illustrating a monitoring circuit 134 in accordance with one embodiment of the present invention. The monitoring circuit 134 can include an oscillating unit 134*a*, a signal processing unit 134*b*, a comparator 134*c*, a dividing unit 134*d*, and an inverting unit 134*e*.

In this embodiment, the signal processing unit 134*b* is electrically connected to the oscillating unit 134*a*. The comparator 134*c* is electrically connected to the signal processing unit 134*b*. The dividing unit 134*d* is electrically connected to the oscillating unit 134*a* and the comparator 134*c*. The inverting unit 134*e* is electrically connected to the comparator 134*c*.

In this embodiment, the oscillating unit 134*a* can include a first monitoring end S1 and a second monitoring end S2. The first monitoring end S1 can be electrically connected to the connection port 142 for the ESD protection device 10, and can be configured to be electrically connected to the ESD protection device 10. The second monitoring end S2 can be electrically connected to the connection port 144 for the ground line 12, and can be configured to be electrically connected to the ground line 12. The signal processing unit 134*b* can include a filter subunit 134*b*1 and a dividing subunit 134*b*2. The filter subunit 134*b*1 can include a capacitor (e.g., capacitor C3). The dividing subunit 134*b*2 can include resistors (e.g., resistors R6, R7). The inverting unit 134*e* can include a signal output end SIG_OUT. The signal output end SIG_OUT can be electrically connected to the control module 132.

In a error condition, that is, in a case that the first monitoring end S1 is not electrically contacted to the user's body (i.e., the ESD protection 10 is not electrically connected to the connection port 142 for the ESD protection 10 or the ESD protection device 10 is not electrically contacted to the use body) or the second monitoring end S2 is not electrically connected to the ground (i.e., the ground line 12 is not electrically connected to the connection port 144 for the ground line 12 or the ground line 12 is not connected to the ground), the oscillating unit 134*a* can perform an oscillation and output an oscillating signal. The oscillating signal is, for example, a sine wave.

The signal processing unit 134*b* can receive the oscillating signal, and output a first voltage according the oscillating signal. For example, the filter subunit 134*b*1 can filter the oscillating single by a capacitor (e.g., capacitor C3), so as to output the first voltage.

The comparator 134*c* can compare the first voltage and a reference voltage Vref, and correspondingly output an alarm signal (e.g., low voltage level). The first voltage can be, for example, smaller than the reference voltage Vref. The reference voltage Vref, for example, is provided by the dividing unit 134*d*.

The inverting unit 134*e* can receive and invert the alarm signal, and output an inverted alarm signal (e.g., high voltage level) through the signal output end SIN_OUT. One skilled in the art can understand that, in some embodiment, the inverting unit 134*e* can be omitted.

In such a configuration, the monitoring circuit 134 can output the alarm signal when the first monitoring end S1 is not electrically contacted to the user's body or the second monitoring end S2 is not electrically connected to the ground, such that the manager can acknowledge that there is an error condition, and to prevent electrostatic charges to enter into the electronic products and damage the electronic products.

On the other hand, in this embodiment, in a normal state, that is, in a state that the first monitoring end S1 is electrically contacted to the user's body (i.e., the ESD protection 10 is electrically connected to the connection port 142 for the ESD protection 10 and the ESD protection device 10 is electrically contacted to the user body) and the second monitoring end S2 is electrically connected to the ground (i.e. the ground line 12 is electrically connected to the connection port 144 for the ground line 12 and the ground line 12 is connected to the ground), the first and second monitoring ends S1, S2 can be regards as electrically connected to a capacitor formed by the user's body. In this time, the oscillating condition of the oscillating unit 134*a* is broken, and the oscillating unit 134*a* can output a DC voltage signal. The signal processing unit 134*b* can receive the DC voltage signal, and output a second voltage according to the DC voltage signal through resistors (e.g., the resistors R6, R7). For example the dividing subunit 134*b*2 can divide a supply voltage (e.g., supply voltage VCC) and output the second voltage according to the DC voltage signal through the resistors (e.g., the resistors R6, R7). The comparator 134*c* can compare the second voltage and the reference voltage Vref, and accordingly stop output the alarm signal (e.g., output a high voltage level). The second voltage is, for example, greater than the reference voltage Vref.

Moreover, in this embodiment, the dividing unit 134d can provide an electrostatic ground voltage to the second monitoring end S2. The electrostatic ground voltage is, for example, equal to the reference voltage Vref.

In the following paragraphs, more details of the monitoring circuit 134 would be provided. However, the present invention is not be limited to the embodiment described following.

In one embodiment, the oscillating unit includes an amplifier OP, a resistor R1, a resistor R2, a resistor R3, a resistor R4, a capacitor C1, a capacitor C2, a resistor R5, and a variable resistor VR. The amplifier OP includes a first input end, a second input end, an output end, a positive power supply end, and a negative power supply end. The positive power supply end of the amplifier OP can receive the supply voltage VCC, and the negative positive power supply end of the amplifier OP can be connected to the ground. The output end of the amplifier OP (e.g., point K) can output the oscillating signal or the DC voltage signal. All of the resistors R1-R5, the capacitor C1-C2, and the variable resistor VR include a first end and a second end. The first end of the resistor R1 is electrically connected to the first monitoring end S1, and the second end of the resistor R1 is electrically connected to the output end of the amplifier OP. The first end of the resistor R2 is electrically connected to the first monitoring end S1 and the second end of the resistor R2 is electrically connected to the second input end of the amplifier OP. The first end of the resistor R3 is electrically connected to the second monitoring end S2, and the second end of the resistor R3 is electrically connected to the second input end of the amplifier OP. The first end of the resistor R4 is electrically connected to the output end of the amplifier OP, and the second end of the resistor R4 is electrically connected to the first input end of the amplifier OP. The first end of the capacitor C1 is electrically connected to the first input end of the amplifier. The first end of the capacitor C2 is electrically connected to the output end of the amplifier OP. The first end of the resistor R5 is electrically connected to the second end of the capacitor C1 and the second end of the capacitor C2. The first end of the variable resistor VR is electrically connected to the second end of the fifth resistor, the second end of the variable resistor VR is electrically connected to the second monitoring end S2. It should be noted that, in this embodiment, the variable resistor VR is configured to adjust the oscillating characteristic of the oscillating unit 134a, and the variable resistor VR can be omitted in other embodiment.

The signal processing unit 134b includes a diode D1, a resistor R6, a resistor R7, and a capacitor C3. The diode D1 includes a cathode end and an anode end. All of the resistor R6, the resistor R7, and the capacitor C3 include a first end and a second end. The cathode end of the diode D1 is electrically connected to the first end of the resistor R4. The first end of the resistor R6 is electrically connected to the comparator 134c, and the second end of the resistor R6 is electrically connected to the anode end of the diode D1. The first end of the resistor R7 is electrically connected to the first end of the resistor R6, and the second end of the resistor R7 is configured to receive the supply voltage VCC.

The comparator 134c includes a first input end, a second input end, and an output end. The first input end of the comparator 134c can be electrically connected to the first end of the resistor R6, and second input end of the comparator 134c can receive the reference voltage Vref.

The dividing unit 134d includes a resistor R8 and resistor R9. Both of the resistor R8 and the resistor R9 have a first end and a second end. The first end of the resistor R8 can receive the supply voltage VCC, and the second end of the resistor R9 can be electrically connected to the second monitoring end S2. The first end of the resistor R9 can be electrically connected to the second end of the resistor R8, and the second end of the resistor R9 can be electrically connected to the ground. In this embodiment, the electrostatic voltage provided by the dividing unit 134d to the second monitoring end S2 is, for example, VCC/2. In addition, in this embodiment, the reference voltage Vref can be equal to the electrostatic voltage, and that is, VCC/2.

The inverting unit 134e includes a resistor R10 and a transistor T1. The resistor R10 includes a first end and a second end. The transistor T1 includes a first end, a second end, and a control end. The first end of the resistor R10 can receive the supply voltage VCC, and the second end of the resistor R10 can be electrically connected to the signal output end SIN_OUT. The first end of the transistor T1 can be electrically connected to the second end of the resistor R10, the second end of the transistor T1 can be connected to the ground, and the control end of the transistor T1 can receive the alarm signal.

In such a configuration, the oscillating unit 134a can output the oscillating signal with amplitude VCC/2 in the case that the first monitoring end S1 is not electrically contacted to the user's body or the second monitoring end S2 is not electrically connected to the ground. In this time, the signal processing unit 134b can be served as a filter circuit which filters the oscillating signal by utilizing the capacitor C3. That is, in the wave trough of the oscillating signal, the voltage V_K of the output end (i.e., point K) of the amplifier OP is 0, the diode D1 is conducted, the capacitor C1 is charged, and the voltage V_Q of the first input end (i.e., point Q) of the comparator 134c is equal to Vth_D1+VCC×(R6/(R6+R7)) wherein the voltage Vth_D1 is the threshold voltage of the diode D1, for example, can be 0.6V. On the other hand, in the wave peak of the oscillating signal, the voltage V_K of the output end (i.e., point K) of the amplifier OP is VCC, the diode D1 is turned off, the capacitor C1 is discharged, and the voltage V_Q of the first input end (i.e., point Q) of the comparator 134c is substantially maintained at Vth_D1+VCC×(R6/(R6+R7)). Therefore, through the configuration of resistances of the resistors R6, R7 (e.g., R6=10 kΩ, R7=470 kΩ), the voltage V_Q of the first input end (i.e., point Q) of the comparator 134c can be smaller than the reference voltage Vref (e.g., VCC/2), and the output end of the comparator 134c can output the alarm signal having the low voltage level. Accordingly, the transistor T1 is turned off corresponding to the alarm signal having the low voltage level, and the signal output end SIG_OUT outputs the high voltage level, that is, the inversed alarm signal.

On the other hand, the oscillating unit 134a can output the DC voltage signal in the case that the first monitoring end S1 is electrically contacted to the user's body and the second monitoring end S2 is connected to the ground. In this time, the signal processing unit 134b can be served as a dividing circuit. That is, the voltage V_K of the output end (i.e., point K) of the amplifier OP is VCC/2, the diode D1 is conducted, the capacitor C1 is charged, and the voltage V_Q of the first input end (i.e., point Q) of the comparator 134c is equal to VCC/2+Vth_D1+VCC×(R6/(R6+R7)). Therefore, through the configuration of resistances of the resistors R6, R7 (e.g., R6=10 kΩ, R7=470 kΩ), the voltage V_Q of the first input end (i.e., point Q) of the comparator 134c can be greater than the reference voltage Vref (e.g., VCC/2), and the output end of the comparator 134c do not output the alarm signal, that is, the comparator 134c outputs the high voltage level. Accordingly, the transistor T1 is turned on corresponding to the high voltage level, and the signal output end SIG_OUT outputs the low voltage level.

In such a configuration, the monitoring circuit 134 can inform the manager by the alarm signal when there is an error condition, so as to prevent electrostatic charges to enter into the electronic products and damage the electronic products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A monitoring circuit, configured to be electrically connected to an electrostatic discharge (ESD) protection device and a ground line, the ESD protection device being configured to be in contact with a users body, the ground line is configured to be connected to the ground, the monitoring circuit comprising:
    an oscillating unit comprising a first monitoring end and a second monitoring end, wherein the first monitoring end is configured to be electrically connected to the ESD protection device and the second monitoring end is configured to be electrically connected to the ground line, wherein the oscillating unit is configured to output an oscillating signal in a case that the first monitoring end is not electrically connected to the ESD protection device, or the ESD protection device is not contacted to the user's body, or the second monitoring end is not electrically connected to the ground line, or the ground line is not connected to the ground, and wherein the oscillating unit is configured to output a DC voltage signal in a case that the first monitoring end is electrically connected to the ESD protection device, and the ESD protection device is contacted to the user's body, and the second monitoring end is electrically connected to the ground line, and the ground line is connected to the ground;
    a signal processing unit electrically connected to the oscillating unit, configured to receive the oscillating signal and to output a first voltage according to the oscillating signal if the signal outputted by the oscillating unit is the oscillating signal wherein the signal processing unit comprises a dividing subunit configure to divide a supply voltage according to the oscillating signal, so as to output the first voltage;
    a dividing unit electrically connected to the second monitoring end, configured to provide an electrostatic ground voltage to the second monitoring end and a reference voltage; and
    a comparator electrically connected to the signal processing unit and the dividing unit, configured to co pare the first voltage and the reference voltage and to correspondingly output an alarm signal when the first voltage becomes smaller than the reference voltage.

2. The monitoring circuit as claimed in claim 1, wherein the signal processing unit comprising:
    a filter subunit comprising a capacitor, wherein the filter subunit is configured to filter the oscillating signal utilizing the capacitor, so as to output the first voltage.

3. The monitoring circuit as claimed in claim 1, wherein the signal processing unit is further configured to output a second voltage according to the DC voltage signal if the signal outputted by the oscillating unit is the DC voltage, and the comparator is further configured to compare the second voltage and the reference voltage and to correspondingly stop outputting the alarm signal when the second voltage becomes greater than the reference voltage.

4. The monitoring circuit as claimed in claim 3, wherein the dividing subunit is further configured to divide the supply voltage according to the DC voltage signal, so as to output the second voltage.

5. The monitoring circuit as claimed in claim 1, wherein the electrostatic ground voltage is equal to the reference voltage.

6. The monitoring circuit as claimed in claim 1, wherein the oscillating unit comprises:
    an amplifier comprising a first input end, a second input end and an output end, wherein the output end of the amplifier is configured to output the oscillating signal;
    a first resistor comprising a first end and a second end, wherein the first end of the first resistor is electrically connected to the first monitoring end, and the second end of the first resistor is electrically connected to the output end of the amplifier;
    a second resistor comprising a first end and a second end, wherein the first end of the second resistor is electrically connected to the first monitoring end, and the second end of the second resistor is electrically connected to the second input end of the amplifier;
    a third resistor comprising a first end and a second end, wherein the first end of the third resistor is electrically connected to the second monitoring end, and the second end of the third resistor is electrically connected to the second input end of the amplifier;
    a fourth resistor comprising a first end and a second end, wherein the first end of the fourth resistor is electrically connected to the output end of the amplifier, and the second end of the fourth resistor is electrically connected to the first input end of the amplifier;
    a first capacitor comprising a first end and a second end, wherein the first end of the first capacitor is electrically connected to the first input end of the amplifier;
    a second capacitor comprising a first end and a second end, wherein the first end of the second capacitor is electrically connected to the output end of the amplifier;
    a fifth resistor comprising a first end and a second end, wherein the first end of the fifth resistor is electrically connected to the second end of the first capacitor and the second end of the second capacitor; and
    a variable resistor comprising a first end and a second end, wherein the first end of the variable resistor is electrically connected to the second end of the fifth resistor, the second end of the variable resistor is electrically connected to the second monitoring end.

7. The monitoring circuit as claimed in claim 6, wherein the signal processing unit comprises:
    a diode comprising a cathode end and an anode end, wherein the cathode end of the diode is electrically connected to the first end of the fourth resistor;
    a sixth resistor comprising a first end and a second end, wherein the first end of the sixth resistor is electrically connected to the comparator, and the second end of the sixth resistor is electrically connected to the anode end of the diode;
    a seventh resistor comprising a first end and a second end, wherein the first end of the seventh resistor is electrically connected to the first end of the sixth resistor, and the second end of the seventh resistor is configured to receive a supply voltage; and
    a third capacitor comprising a first end and a second end, wherein the first end of the third capacitor is electrically connected to the first end of the sixth resistor, the second end of the third capacitor is configured to receive the supply voltage.

8. A monitoring system, comprising:
a monitoring server configured to output a state request signal; and
at least one annunciator electrically connected to the monitoring server, the annunciator comprising:
a communication module;
a monitoring circuit configured to be electrically connected to a ESD protection device and a ground line, wherein the ESD protection device is configured to be contacted with a user's body, the ground line is configured to be connected to the ground, and the monitoring circuit comprises:
an oscillating unit comprising a first monitoring end and a second monitoring end, wherein the first monitoring end is configured to be electrically connected to the ESD protection device and the second monitoring end is configured to be electrically connected to the ground line, wherein the oscillating unit is configured to output an oscillating signal in a case that the first monitoring end is not electrically connected to the ESD protection device, or the ESD protection device is not contacted to the user's body, or the second monitoring end is not electrically connected to the ground line, or the ground line is not connected to the ground, and wherein the oscillating unit is configured to output a DC voltage signal in a case that the first monitoring end is electrically connected to the ESD protection device, and the ESD protection device is contacted to the user's body, and the second monitoring end is electrically connected to the ground line, and the ground line is connected to the ground;
a signal processing unit electrically connected to the oscillating unit, configured to receive the oscillating signal and to output a first voltage according to the oscillating signal if the signal outputted by the oscillating unit is the oscillating signal, wherein the signal processing unit comprises a dividing subunit configured to divide a supply voltage according to the oscillating signal, so as to output the first voltage;
a dividing unit electrically connected to the second monitoring end, configured to provide an electrostatic ground voltage to the second monitoring end and a reference voltage; and
a comparator electrically connected to the signal processing unit, configured to compare the first voltage and the reference voltage provided from the dividing unit and to correspondingly output an alarm signal when the first voltage becomes smaller than the reference voltage; and
a control module configured to receive the alarm signal and the state request signal, and to output a state reply signal to the monitoring server through the communication module according the alarm signal and the state request signal.

9. The monitoring system as claimed in claim 8, wherein the signal processing unit comprising:
a filter subunit comprising a capacitor, wherein the filter subunit is configured to filter the oscillating signal utilizing the capacitor, so as to output the first voltage.

10. The monitoring system as claimed in claim 8, wherein the signal processing unit is further configured to output a second voltage according to the DC voltage signal if the signal outputted by the oscillating unit is the DC voltage, and the comparator is further configured to compare the second voltage and the reference voltage and to correspondingly stop outputting the alarm signal when the second voltage becomes greater than the reference voltage.

11. The monitoring system as claimed in claim 10, wherein the dividing subunit is further configured to divide the supply voltage according to the DC voltage signal, so as to output the second voltage.

12. The monitoring system as claimed in claim 8, wherein the electrostatic ground voltage is equal to the reference voltage.

13. The monitoring system as claimed in claim 8, wherein the oscillating unit comprises:
an amplifier comprising a first input end, a second input end and an output end, wherein the output end of the amplifier is configured to output the oscillating signal;
a first resistor comprising a first end and a second end, wherein the first end of the first resistor is electrically connected to the first monitoring end, and the second end of the first resistor is electrically connected to the output end of the amplifier;
a second resistor comprising a first end and a second end, wherein the first end of the second resistor is electrically connected to the first monitoring end, and the second end of the second resistor is electrically connected to the second input end of the amplifier;
a third resistor comprising a first end and a second end, wherein the first end of the third resistor is electrically connected to the second monitoring end, and the second end of the third resistor is electrically connected to the second input end of the amplifier;
a fourth resistor comprising a first end and a second end, wherein the first end of the fourth resistor is electrically connected to the output end of the amplifier, and the second end of the fourth resistor is electrically connected to the first input end of the amplifier;
a first capacitor comprising a first end and a second end, wherein the first end of the first capacitor is electrically connected to the first input end of the amplifier;
a second capacitor comprising a first end and a second end, wherein the first end of the second capacitor is electrically connected to the output end of the amplifier;
a fifth resistor comprising a first end and a second end, wherein the first end of the fifth resistor is electrically connected to the second end of the first capacitor and the second end of the second capacitor; and
a variable resistor comprising a first end and a second end, wherein the first end of the variable resistor is electrically connected to the second end of the fifth resistor, and the second end of the variable resistor is electrically connected to the second monitoring end.

14. The monitoring system as claimed in claim 13, wherein the signal processing unit comprises:
a diode comprising a cathode end and an anode end, wherein the cathode end of the diode is electrically connected to the first end of the fourth resistor;
a sixth resistor comprising a first end and a second end, wherein the first end of the sixth resistor is electrically connected to the comparator, and the second end of the sixth resistor is electrically connected to the anode end of the diode;
a seventh resistor comprising a first end and a second end, wherein the first end of the seventh resistor is electrically connected to the first end of the sixth resistor, and the second end of the seventh resistor is configured to receive a supply voltage; and a third capacitor comprising a first end and a second end, wherein the first end of the third capacitor is electrically connected to the first end of the sixth resistor, and the second end of the third capacitor is configured to receive the supply voltage.

* * * * *